United States Patent
Foad et al.

(10) Patent No.: US 8,927,400 B2
(45) Date of Patent: Jan. 6, 2015

(54) SAFE HANDLING OF LOW ENERGY, HIGH DOSE ARSENIC, PHOSPHORUS, AND BORON IMPLANTED WAFERS

(71) Applicant: Applied Materials, Inc., Santa Clara, CA (US)

(72) Inventors: Majeed A. Foad, Sunnyvale, CA (US); Manoj Vellaikal, Sunnyvale, CA (US); Kartik Santhanam, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/275,408

(22) Filed: May 12, 2014

(65) Prior Publication Data

US 2014/0248759 A1    Sep. 4, 2014

Related U.S. Application Data

(63) Continuation of application No. 12/730,068, filed on Mar. 23, 2010, which is a continuation of application No. 11/958,541, filed on Dec. 18, 2007, now abandoned.

(60) Provisional application No. 60/870,575, filed on Dec. 18, 2006.

(51) Int. Cl.
| | |
|---|---|
| *H01L 21/70* | (2006.01) |
| *H01L 21/30* | (2006.01) |
| *H01J 37/32* | (2006.01) |
| *H01L 21/02* | (2006.01) |
| *H01L 21/223* | (2006.01) |
| *H01L 21/316* | (2006.01) |

(52) U.S. Cl.
CPC ....... *H01L 21/3003* (2013.01); *H01J 37/32357* (2013.01); *H01L 21/02164* (2013.01); *H01L 21/02211* (2013.01); *H01L 21/0223* (2013.01); *H01L 21/02252* (2013.01); *H01L 21/02274* (2013.01); *H01L 21/2236* (2013.01); *H01L 21/31662* (2013.01)
USPC .................................. 438/514; 257/E21.057

(58) Field of Classification Search
None
See application file for complete search history.

(56) References Cited

U.S. PATENT DOCUMENTS

| | | | |
|---|---|---|---|
| 4,226,667 | A | 10/1980 | Logan |
| 5,196,370 | A | 3/1993 | Tara et al. |

(Continued)

FOREIGN PATENT DOCUMENTS

| | | |
|---|---|---|
| JP | 11-031665 A | 2/1999 |
| JP | 2003-282473 A | 10/2003 |

OTHER PUBLICATIONS

International Search Report and Written Opinion dated Apr. 30, 2008 for International Application No. PCT/US07/87894.

(Continued)

*Primary Examiner* — Calvin Choi
(74) *Attorney, Agent, or Firm* — Patterson & Sheridan, LLP

(57) ABSTRACT

A method of preventing toxic gas formation after an implantation process is disclosed. Certain dopants, when implanted into films disposed on a substrate, may react when exposed to moisture to form a toxic gas and/or a flammable gas. By in-situ exposing the doped film to an oxygen containing compound, dopant that is shallowly implanted into the layer stack reacts to form a dopant oxide, thereby reducing potential toxic gas and/or flammable gas formation. Alternatively, a capping layer may be formed in-situ over the implanted film to reduce the potential generation of toxic gas and/or flammable gas.

11 Claims, 4 Drawing Sheets

(56) References Cited

U.S. PATENT DOCUMENTS

| | | | |
|---|---|---|---|
| 6,039,851 A * | 3/2000 | Iyer | 204/192.32 |
| 6,239,034 B1 * | 5/2001 | Yang et al. | 438/697 |
| 6,274,512 B1 * | 8/2001 | Hayashi et al. | 438/766 |
| 6,344,884 B1 * | 2/2002 | Kim et al. | 349/43 |
| 6,376,285 B1 | 4/2002 | Joyner et al. | |
| 6,566,283 B1 * | 5/2003 | Pangrle et al. | 438/788 |
| 6,716,704 B2 | 4/2004 | Lee et al. | |
| 6,743,651 B2 | 6/2004 | Chu et al. | |
| 7,064,399 B2 | 6/2006 | Babcock et al. | |
| 2001/0001729 A1 | 5/2001 | Leverd et al. | |
| 2002/0033233 A1 | 3/2002 | Savas | |
| 2002/0098627 A1 * | 7/2002 | Pomarede et al. | 438/149 |
| 2003/0047028 A1 * | 3/2003 | Kunitake et al. | 75/230 |
| 2003/0067037 A1 * | 4/2003 | Lu et al. | 257/347 |
| 2004/0072446 A1 | 4/2004 | Liu et al. | |
| 2005/0090080 A1 | 4/2005 | Fogel et al. | |
| 2005/0130424 A1 | 6/2005 | Bedell et al. | |
| 2005/0161434 A1 | 7/2005 | Sugawara et al. | |
| 2005/0266617 A1 | 12/2005 | Ichitsubo et al. | |
| 2006/0011906 A1 | 1/2006 | Bedell et al. | |
| 2006/0040484 A1 * | 2/2006 | Dokumaci et al. | 438/595 |
| 2006/0073683 A1 | 4/2006 | Collins et al. | |
| 2006/0105507 A1 | 5/2006 | Ieong et al. | |
| 2006/0205192 A1 * | 9/2006 | Walther et al. | 438/513 |
| 2006/0226480 A1 | 10/2006 | Furukawa et al. | |

OTHER PUBLICATIONS

International Search Report and Summary of Official Letter dated Jan. 18, 2012 for Taiwanese Patent Application 096148507.

Japanese Office Action, Patent Application: 2009-541642, dated Mar. 5, 2013.

Korean Office Action for Application No. 10-2009-7015192 dated Oct. 29, 2013.

Taiwan Office Action dated Jul. 3, 2014.

\* cited by examiner

SAFE HANDLING OF LOW ENERGY, HIGH DOSE ARSENIC, PHOSPHORUS, AND BORON IMPLANTED WAFERS

CROSS-REFERENCE TO RELATED APPLICATIONS

This application is a continuation of U.S. patent application Ser. No. 12/730,068, filed Mar. 23, 2010, which is a continuation of U.S. patent application Ser. No. 11/958,541, filed Dec. 18, 2007, which claims benefit of U.S. provisional patent application Ser. No. 60/870,575, filed Dec. 18, 2006. Each of the aforementioned related patent applications is hereby incorporated by reference herein.

BACKGROUND OF THE INVENTION

1. Field of the Invention

Embodiments of the invention generally relate to the field of semiconductor manufacturing processes and, more particularly, to methods of making substrates that have been implanted with arsenic, phosphorus, or boron safer to handle.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

An ion implantation process is typically utilized to implant and dope ions into the substrate, forming the gate and source drain structure with desired profile and concentration on the substrate. During an ion implantation process, different process gases or gas mixtures may be used to provide ion source species such as arsenic, phosphorus, or boron. Arsenic, in particular, will react when exposed to moisture to produce arsenic oxide and arsine gas according to the following reaction:

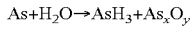

$$As + H_2O \rightarrow AsH_3 + As_xO_y$$

Arsine gas is a highly toxic gas that is also flammable. When high doses of dopant (i.e., about $1 \times 10^{16}$ l/cm$^2$ or more) and low implantation energy (i.e., about 2 kV) is applied, the dopant does not implant deeply into the layer stack. Thus, more dopant is present near or at the surface of the layer stack and may be exposed to moisture upon removal from the chamber. The arsenic residing near the surface may react to undesirably form arsine gas.

Therefore, there is a need for a method to prevent toxic compounds from forming after dopants have been implanted.

SUMMARY OF THE INVENTION

The present invention generally comprises a method of preventing toxic gas formation after an implantation process. Certain dopants, when implanted into a film disposed on a substrate, may react when exposed to moisture to form a toxic gas and/or a flammable gas. In one embodiment, a dopant is initially implanted into a film formed on a substrate and then the implanted film is exposed to an oxygen containing gas to form a protective oxide layer. The oxide layer may be formed in the same chamber in which the film was implanted.

In another embodiment, a substrate processing method comprises implanting a dopant into a film disposed in a processing chamber and exposing the implanted film to an oxygen containing plasma to form an oxide layer on the implanted film and trap the dopant within the film prior to exposure of the implanted film to atmospheric oxygen.

In another embodiment, a dopant is initially implanted into a film formed on a substrate and then a capping layer is deposited over the implanted film. The capping layer may be deposited in the same chamber in which the film was implanted.

In another embodiment, a substrate processing method comprises implanting a dopant into a film disposed on a substrate in a processing chamber and depositing a capping layer over the dopant implanted film prior to exposure of the implanted film to atmospheric oxygen, wherein the capping layer is selected from the group consisting of a carbon layer, a silicon layer, a silicon oxide layer, a silicon nitride layer, a silicon carbide layer, an organic layer, and combinations thereof.

In another embodiment, a substrate processing method comprises implanting a dopant into a film disposed on a substrate in a processing chamber and removing excess dopants by etching the implanted film with a plasma formed from $NF_3$ prior to exposure of the implanted film to atmospheric oxygen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
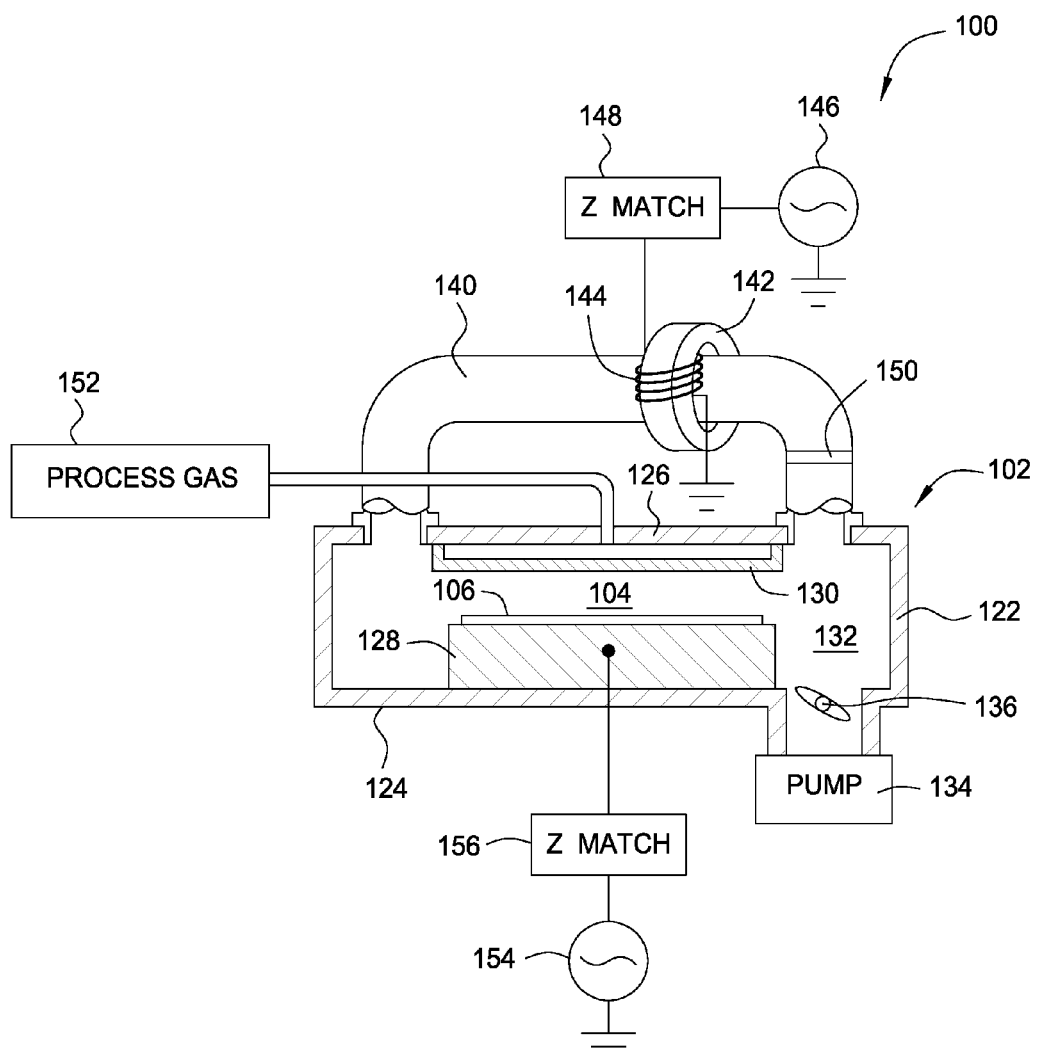
FIGS. 1A-1B depict one embodiment of a plasma immersion ion implantation tool suitable for practicing the present invention.

The present invention describes a method of preventing toxic gas formation after an implantation process. FIG. 1A depicts a plasma reactor 100 that may be utilized to practice ion implantation, oxide layer formation, and capping layer formation according to one embodiment of the invention. One suitable reactor which may be adapted to practice the invention is a P3i™ reactor, available from Applied Materials, Inc., of Santa Clara, Calif. Another reactor which may be adapted to practice the invention is described in U.S. patent application Ser. No. 11/608,357, filed Dec. 8, 2006, which is hereby incorporated by reference in its entirety. It is contemplated that the methods described herein may be practiced in other suitably adapted plasma reactors, including those from other manufacturers.

The plasma reactor 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A gas source 152 is coupled to the gas distribution plate 130 to supply gaseous precursor compounds for processes performed on the substrate 106.

Figure 1B:
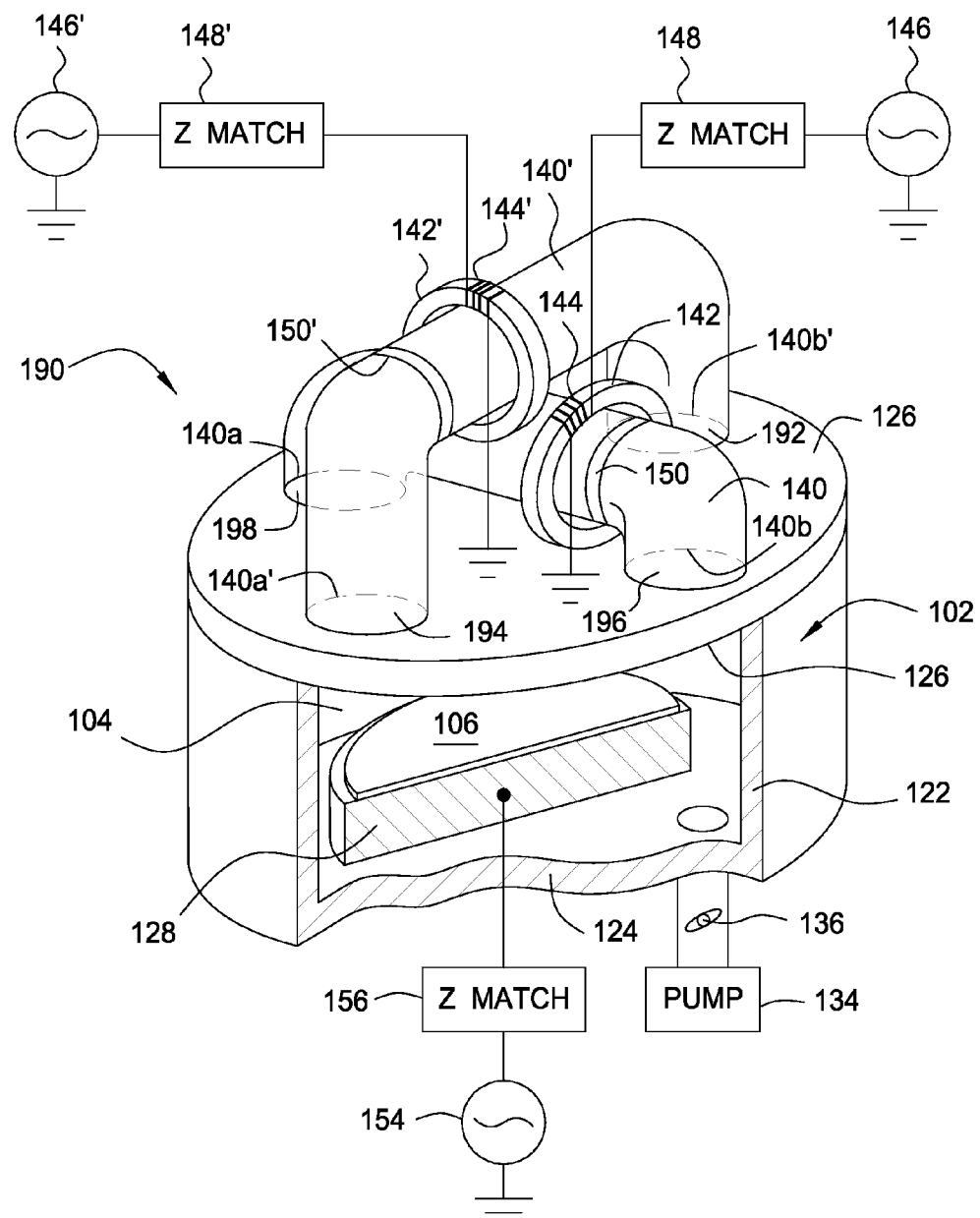

The reactor 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another, as shown in the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140b has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b. 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may be configured as other distributions utilized to provide uniform plasma distribution into the process region 104.

Magnetically permeable torroidal cores 142, 142' surround a portion of a corresponding one of the external reentrant conduits 140, 140'. The conductive coils 144, 144' are coupled to respective RF plasma source power generators 146, 146' through respective impedance match circuits or elements 148, 148'. Each external reentrant conduit 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF source plasma power 146 is coupled from the power applicator to gases supplied in the conduit 140, which creates a circulating plasma current in a first closed torroidal path including the external reentrant conduit 140 and the process region 104. Also, RF source power 146' may be coupled from the other power applicator to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF source power generators 146, 146', which may be the same or slightly offset from one another.

In one embodiment, the process gas source 152 provides different process gases that may be utilized to provide ions implanted to the substrate 106. Suitable examples of process gases include $B_2H_6$, $BF_3$, $SiH_4$, $SiF_4$, $PH_3$, $P_2H_5$, $PO_3$, $PF_3$, $PF_5$ and $CF_4$, among others. The power of each plasma source power generators 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of the substrate 106 with desired ion concentration. For example, with relatively low RF power, such as less than about 50 eV, relatively low plasma ion energy may be obtained. Dissociated ions with low ion energy may be implanted at a shallow depth between about 0 Å and about 100 Å from the substrate surface. Alternatively, dissociated ions with high ion energy provided and generated from high RF power, such as higher than about 50 eV, may be implanted into the substrate having a depth substantially over 100 Å depth from the substrate surface.

The combination of the controlled RF plasma source power and RF plasma bias power dissociates ions in the gas mixture having sufficient momentum and desired ion distribution in the processing chamber 100. The ions are biased and driven toward the substrate surface, thereby implanting ions into the substrate with desired ion concentration, distribution and depth from the substrate surface. Furthermore, the controlled ion energy and different types of ion species from the supplied process gases facilitates ions implanted in the substrate 106, forming desired device structure, such as gate structure and source drain region on the substrate 106.

Figure 2:
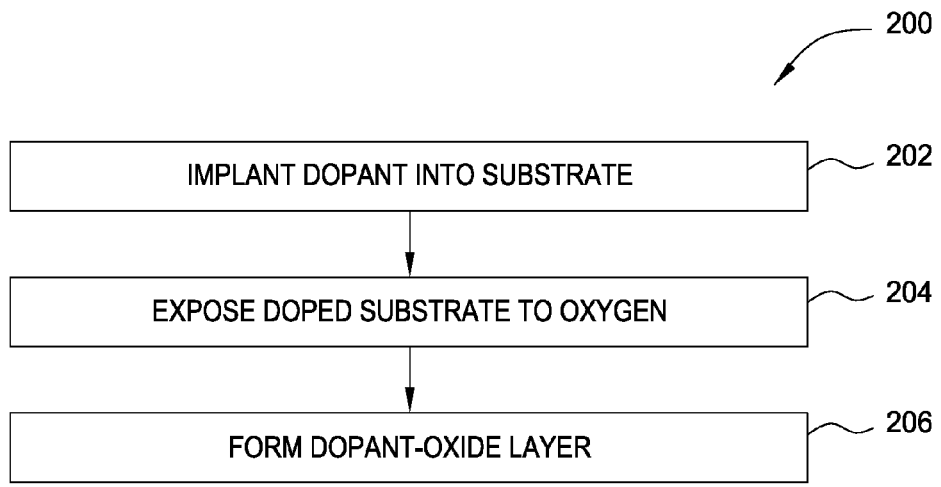
FIG. 2 depicts a process diagram illustrating a method for a dopant oxide formation process according to one embodiment of the present invention.

FIG. 2 depicts a process flow diagram of a method 200 for forming a dopant oxide layer after an implantation process. The method 200 begins at step 202 where a dopant is implanted into a film formed on a substrate. The term film is a generic term encompassing one or more layers of material that may be stacked on the substrate. In one embodiment, the dopant comprises arsenic. In another embodiment, the dopant comprises phosphorus. In yet another embodiment, the dopant comprises boron.

After the dopant is implanted into the layer stack, the method continues at step 204 where the implanted (e.g., doped) layer is exposed to an oxygen containing gas. The exposure may occur in-situ within the same chamber in which the layer was implanted. The substrate having the doped layer may remain in the chamber after the implantation to ensure that the dopant is not exposed to moisture, which may react with the dopant to form a toxic or flammable gas. In one embodiment, the implanted (e.g., doped) layer may be exposed to the oxygen containing gas in a separate chamber without exposing the layer to atmosphere and hence, moisture.

By exposing the implanted layer to an oxygen containing gas, oxygen reacts to form an oxide on the surface of the implanted film at step 206. The oxide may be that of the dopant and/or the implanted film. Suitable oxygen containing gases that may be used include atomic oxygen (O), oxygen ($O_2$), ozone ($O_3$), nitrous oxide ($N_2O$), nitric oxide (NO), nitrogen dioxide ($NO_2$), dinitrogen pentoxide ($N_2O_5$), plasmas thereof, radicals thereof, derivatives thereof, combinations thereof, or other suitable oxygen sources. The oxygen containing gas may be ignited into a plasma. In one embodiment, the oxygen containing gas is ignited within the same processing chamber as the implantation. In another embodiment, the plasma is ignited remotely and delivered to the chamber. The plasma may be generated by a capacitive source and/or an inductive source.

In one embodiment, the implanted layer may be exposed to a hydrogen containing gas. The implanted layer may be exposed to the hydrogen containing gas either prior to or after the exposure to the oxygen containing gas. In one embodiment, the hydrogen containing gas comprises hydrogen gas. The exposure to a hydrogen containing gas and the exposure to the oxygen containing gas may be repeated a plurality of times. The hydrogen containing gas may be ignited into a plasma. In one embodiment, the hydrogen containing gas is ignited within the same processing chamber as the implantation. In another embodiment, the plasma is ignited remotely and delivered to the chamber. The plasma may be generated by a capacitive source and/or an inductive source. The hydrogen containing gas exposure and the oxygen containing gas exposure may occur within the same processing chamber, but at separate intervals.

In one embodiment, a capping layer may be deposited over the oxide layer formed on the implanted layer. The capping layer may be selected from the group consisting of a carbon layer, a silicon layer, a silicon oxide layer, a silicon nitride layer, a silicon carbide layer, an organic layer, and combinations thereof. The capping layer may be deposited over the oxide layer within the same processing chamber as the implantation. In one embodiment, the capping layer may be deposited in a separate chamber without exposing the layer to atmosphere and hence, moisture. The capping layer may be removed after annealing.

In still another embodiment, the implanted layer may be exposed to a gas to remove excess dopants. By removing excess dopants, the dopants may not activate and thus, hydride formation may be reduced. In one embodiment, the gas may comprise an etching gas. In another embodiment, the gas may comprise $NF_3$. The removal of excess dopants may occur within the same processing chamber as the implantation. In one embodiment, the removal of excess dopants may occur in a separate chamber without exposing the layer to atmosphere and hence, moisture.

The oxide layer formation, the capping layer formation, and the removal of excess dopants may be utilized in any combination. In one embodiment, the oxide layer is formed and no capping layer is formed and excess dopants are not removed. In another embodiment, the capping layer is formed and no oxide layer is formed and excess dopants are not removed. In another embodiment, the excess dopants are removed, but no oxide layer or capping layer is formed. In another embodiment, the oxide layer and the capping layer are formed, but excess dopants are not removed. In another embodiment, the oxide layer is formed and excess dopants are removed, but the capping layer is not formed. In another embodiment, the capping layer is formed and the excess dopants are removed, but the oxide layer is not formed. Additionally, the hydrogen containing gas exposure may occur in any combination with the above oxide layer formation, capping layer formation, and removal of excess dopants.

In forming the oxide layer, the oxygen containing gas may be provided to the chamber at a flow rate of about 300 sccm to about 450 sccm. In another embodiment, the flow rate of oxygen containing gas may be greater than 450 sccm. The oxide layer is formed in the chamber by exposing the implanted film for about 3 seconds to about 10 seconds at a chamber pressure of about 15 mTorr to about 300 mTorr. The oxygen containing gas may be co-flowed to the chamber with a carrier gas. The carrier gas may have a flow rate of about 50 sccm. The carrier gas may comprise an inert gas. In one embodiment, the carrier gas comprises argon.

Figure 3:
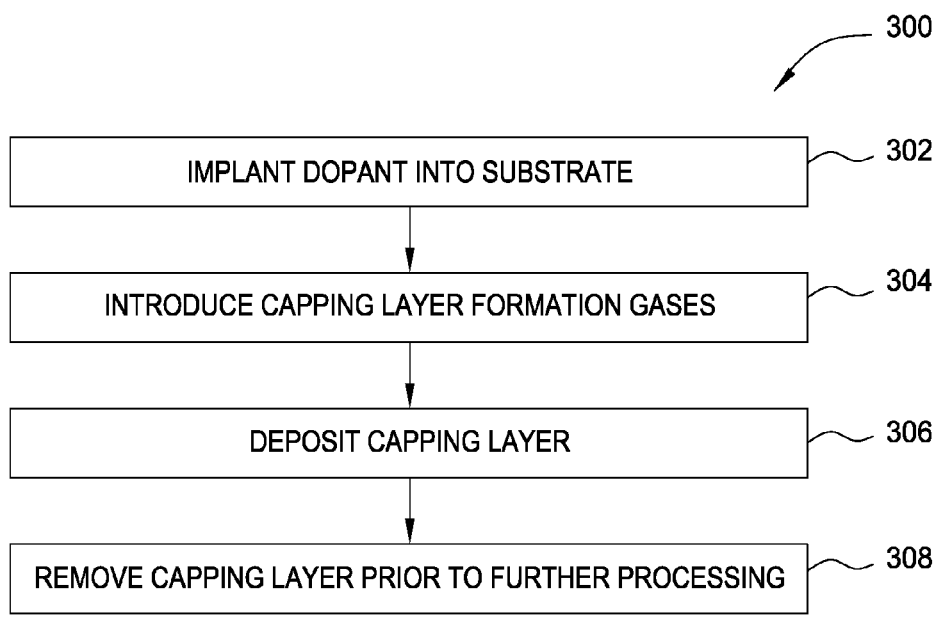
FIG. 3 depicts a process diagram illustrating a method for an in-situ capping process according to one embodiment of the present invention.

FIG. 3 depicts a process flow diagram of a method 300 for forming a capping layer after an implantation process. The method 300 begins at step 302 where a dopant is implanted into a film formed on a substrate. The dopant may be as described above.

After the dopant is implanted into the film, the method continues at step 304 where gases that may be used to deposit a capping layer over the doped layer stack in step 306 are provided. The capping layer may be deposited in-situ the same chamber in which the layer was implanted. By capping the implanted substrate in-situ the same chamber ensures that the dopant is not exposed to moisture, which may react with the dopant to form a toxic or flammable gas.

The capping layer may be deposited by a chemical vapor deposition (CVD) process. One particular CVD process that may be used includes plasma enhanced chemical vapor deposition (PECVD). The capping layer may include silicon, oxygen, nitrogen, carbon, and combinations thereof. Suitable gases that may be introduced to the chamber include silicon containing gases, oxygen containing gases as described above, nitrogen containing gases, and carbon containing gases. In one embodiment, the capping layer comprises a silicon layer. In another embodiment, the capping layer comprises a silicon oxide layer. In yet another embodiment, the capping layer comprises a silicon nitride layer. In still another embodiment, the capping layer comprises a silicon carbide layer.

Examples of suitable silicon gases for forming the capping layer include aminosilanes, aminodisilanes, silylazides, silylhydrazines, or derivatives thereof. Some specific examples of silicon gases include bis(tertbutylamino)silane (BTBAS or ($^t$Bu(H)N)$_2$SiH$_2$), hexachlorodisilane (HCD or Si$_2$Cl$_6$), tetrachlorosilane (SiCl$_4$), dichlorosilane (H$_2$SiCl$_2$), 1,2-diethyltetrakis(diethylamino) disilane ((CH$_2$CH$_3$((CH$_3$CH$_2$)$_2$N)$_2$Si)$_2$), 1,2-dichloro-tetrakis(diethylamino) disilane ((Cl((CH$_3$CH$_2$)$_2$N)$_2$Si)$_2$), hexakis(N-pyrrolidinio) disilane (((C$_4$H$_9$N)$_3$)Si)$_2$), 1,1,2,2-tetrachloro-bis(di(trimethylsilyl)amino) disilane, ((Cl$_2$((CH$_3$)$_3$Si)$_2$N)Si)$_2$), 1,1,2,2-tetrachloro-bis(diisopropylamino) disilane, ((Cl$_2$((C$_3$H$_7$)$_2$N)Si)$_2$), 1,2-dimethyltetrakis(diethylamino) disilane ((CH$_3$(CH$_3$CH$_2$N)$_2$Si)$_2$), tris(dimethylamino)silane azide (((CH$_3$)$_2$N)$_3$SiN$_3$), tris(methylamino)silane azide (((CH$_3$)(H)N)$_3$SiN$_3$), 2,2-dimethylhydrazine-dimethylsilane ((CH$_3$)$_2$(H)Si)(H)NN(CH$_3$)$_2$), trisilylamine ((SiH$_3$)$_3$N or TSA), and hexakis(ethylamino)disilane (((EtHN)$_3$Si)$_2$), radicals thereof, plasmas thereof, derivatives thereof, or combinations thereof. Other suitable silicon gases that may be used include compounds having one or more Si—N bonds or Si—Cl bonds, such as bis(tertbutylamino)silane (BTBAS or ($^t$Bu(H)N)$_2$SiH$_2$) or hexachlorodisilane (HCD or Si$_2$Cl$_6$).

Silicon gases having preferred bond structures described above have the chemical formulas:

(I) $R_2NSi(R'_2)Si(R'_2)NR_2$ (aminodisilanes),
(II) $R_3SiN_3$ (silylazides), or
(III) $R'_3SiNRNR_2$ (silylhydrazines).

In the above chemical formulas, R and R' may be one or more functional groups independently selected from the group of a halogen, an organic group having one or more double bonds, an organic group having one or more triple bonds, an aliphatic alkyl group, a cyclical alkyl group, an aromatic group, an organosilyl group, an alkylamino group, or a cyclic group containing N or Si, or combinations thereof. Specific functional groups include chloro (—Cl), methyl (—$CH_3$), ethyl (—$CH_2CH_3$), isopropyl (—$CH(CH_3)_2$), tert-butyl (—$C(CH_3)_3$), trimethylsilyl (—$Si(CH_3)_3$), pyrrolidine, or combinations thereof.

Other examples of suitable silicon gases include silylazides $R_3SiN_3$ and silylhydrazine class of gases $R_3SiNRNR_2$, linear and cyclic with any combination of R groups. The R groups may be H or any organic functional group such as methyl, ethyl, propyl, butyl, and the like ($C_xH_y$). The R groups attached to Si can optionally be another amino group $NH_2$ or $NR_2$. Examples of specific silylazide compounds include trimethylsilylazide (($CH_3$)$_3SiN_3$) (available from United Chemical Technologies, located in Bristol, Pa.) and tris(dimethylamine)silylazide ((($CH_3$)$_2$N)$_3SiN_3$). An example of a specific silylhydrazine compound is 1,1-dimethyl-2-dimethylsilylhydrazine (($CH_3$)$_2$HSiNHN($CH_3$)$_2$). In another embodiment, a silicon-nitrogen gas may be at least one of ($R_3Si$)$_3N$, ($R_3Si$)$_2NN(SiR_3$)$_2$ and ($R_3Si$)NN(SiR$_3$), wherein each R is independently hydrogen or an alkyl, such as methyl, ethyl, propyl, butyl, phenyl, or combinations thereof. Examples of suitable silicon-nitrogen gases include trisilylamine (($H_3Si$)$_3N$), ($H_3Si$)$_2NN(SiH_3$)$_2$, ($H_3Si$)NN(SiH$_3$), or derivatives thereof.

Examples of suitable nitrogen gases include ammonia ($NH_3$), hydrazine ($N_2H_4$), organic amines, organic hydrazines, organic diazines (e.g., methyldiazine (($H_3$C)NNH)), silylazides, silylhydrazines, hydrogen azide ($HN_3$), hydrogen cyanide (HCN), atomic nitrogen (N), nitrogen ($N_2$), phenyl-hydrazine, azotertbutane, ethylazide, derivatives thereof, or combinations thereof. Organic amines include $R_xNH_{3-x}$, where each R is independently an alkyl group or an aryl group and x is 1, 2, or 3. Examples of organic amines include trimethylamine (($CH_3$)$_3N$), dimethylamine (($CH_3$)$_2$NH), methylamine (($CH_3$)$NH_2$)), triethylamine (($CH_3CH_2$)$_3N$), diethylamine (($CH_3CH_2$)$_2$NH), ethylamine (($CH_3CH_2$)$NH_2$)), tertbutylamine ((($CH_3$)$_3$C)$NH_2$), derivatives thereof, or combinations thereof. Organic hydrazines include $R_xN_2H_{4-x}$, where each R is independently an alkyl group or an aryl group and x is 1, 2, 3, or 4. Examples of organic hydrazines include methylhydrazine (($CH_3$)$N_2H_3$), dimethylhydrazine (($CH_3$)$_2N_2H_2$), ethylhydrazine (($CH_3CH_2$)$N_2H_3$), diethylhydrazine (($CH_3CH_2$)$_2N_2H_2$), tertbutylhydrazine ((($CH_3$)$_3$C)$N_2H_3$), ditertbutylhydrazine ((($CH_3$)$_3$C)$_2N_2H_2$), radicals thereof, plasmas thereof, derivatives thereof, or combinations thereof.

Carbon sources include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others.

The capping layer formation gases may be provided to the chamber with a carrier gas. In one embodiment, argon is used as the carrier gas and may be provided at a flow rate of about 300 sccm. RF power may be supplied at about 200 Watts to about 2000 Watts during CVD.

In one embodiment, a silicon dioxide layer may be deposited over the implanted film by flowing silane gas at 15 sccm, oxygen gas at about 50 sccm to about 60 sccm, argon gas at about 300 sccm, and applying an RF bias of about 200 watts. The deposition occurs for about 1 minute to about 2 minutes and deposits a silicon dioxide capping layer of about 50 Angstroms to about 60 Angstroms thickness. Optionally, the capping layer may be deposited over an oxide layer formed using the method 200.

At step 308, the capping layer is removed prior to further processing. The oxide layer or capping layer deposited in-situ may be removed during later processing and should be thick enough to reduce and/or prevent the dopants from producing toxic and/or flammable gases. However, the oxide or capping layer should also be thin enough that it can be easily removed, for example by a stripping process, without adding excessive processing time or damage to the layer stack.

Table I shows data for five different substrates that were implanted with arsenic as a dopant at 2 kV implantation power and $1\times10^{16}$ l/cm$^2$ dosage level. For each substrate, a different exposure/capping process occurred.

TABLE I

| Substrate | Implantation Power | Dopant | Exposure/ Capping | Dopant oxide/capping layer thickness | | |
|---|---|---|---|---|---|---|
| | | | | 1st day | 3rd day | 5th day |
| 1 | 2 kV | As | None | 34.85 Å | | 42.65 Å |
| 2 | 2 kV | As | 10 seconds O$_2$ (no plasma) | 37.38 Å | | 36.75 Å |
| 3 | 2 kV | As | 3 seconds O$_2$ plasma (no bias) | 51.19 Å | | 56.19 Å |
| 4 | 2 kV | As | 7 seconds O$_2$ plasma (no bias) | 47.15 Å | 47.57 Å | 49.93 Å |
| 5 | 2 kV | As | 3 seconds SiH$_2$/O$_2$ plasma (no bias) | 56.73 Å | | 59.52 Å |

For substrate 1, no in-situ exposure occurred after the implantation. An arsenic oxide layer naturally forms when the arsenic is exposed to moisture, along with arsine gas. The arsenic oxide layer formed to a thickness of 34.85 Angstroms on the first day and the thickness increased to 42.65 Angstroms by the fifth day.

For substrate 2, the implanted film was exposed to oxygen gas for ten seconds without striking a plasma. An arsenic oxide layer was formed to a thickness of 37.38 Angstroms. The thickness was reduced to 36.75 Angstroms by the fifth day. The amount of arsine gas produced was undetectable.

For substrate 3, the implanted film was exposed to an oxygen plasma for 3 seconds without applying a bias. The arsenic oxide layer was formed to a thickness of 51.19 Angstroms. The thickness increased to 56.19 Angstroms by the fifth day. The amount of arsine gas produced was undetectable.

For substrate 4, the implanted film was exposed to an oxygen plasma for 7 seconds without applying a bias. The arsenic oxide layer was formed to a thickness of 47.15 angstroms that increased to 47.57 Angstroms by the third day and increased to 49.93 Angstroms by the fifth day. The amount of arsine gas produced was undetectable.

For substrate 5, a silicon dioxide layer was deposited over the implanted film by introducing a plasma of $SiH_2$ and $O_2$ for 3 seconds. The silicon dioxide layer was formed to a thickness of 56.73 Angstroms. By the fifth day, the thickness has increased to 59.52 Angstroms. The amount of arsine gas produced was undetectable.

Figure 4:
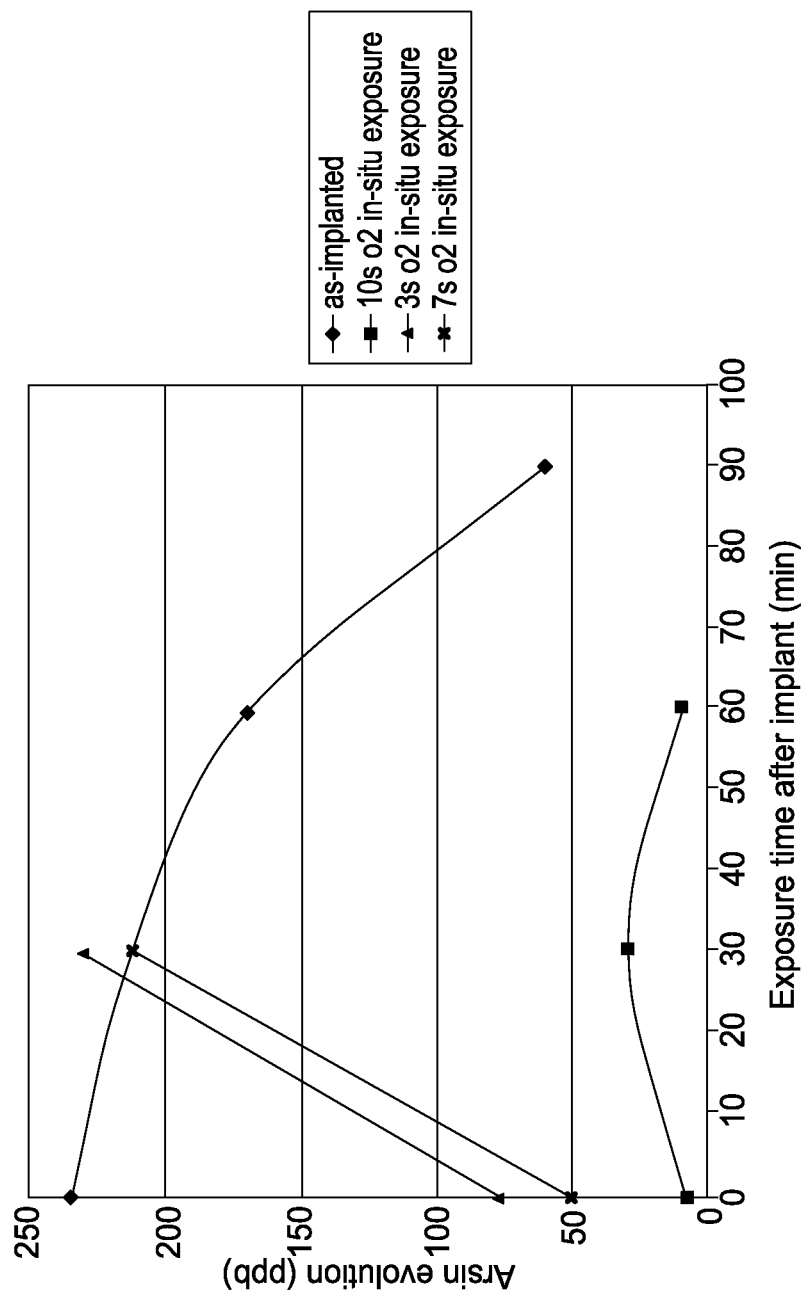
FIG. 4 is a graph showing arsine gas formation over time.

The arsine evolution for substrates 1-4 is shown in FIG. 4. As may be seen from FIG. 4, substrate 1, which does not have an oxide layer formed in-situ, initially permits a large amount of arsine gas to form in addition to and oxide layer. Substrates 2-4, on the other hand, have a much smaller amount of arsine gas that is permitted to form. Substrates 2-4, as discussed above, are exposed to oxygen in-situ within the same chamber in which the layer was implanted and thus, have less arsenic available to produce arsine gas upon exposure to moisture. Because less arsine is formed, substrates 2-4 are much safer to handle.

Oxidizing a dopant implanted film in-situ and/or depositing a capping layer over a dopant implanted film in-situ reduces the amount of toxic and/or flammable gases that may be produced upon exposing the layer stack to moisture. It is also contemplated that the implantation and oxidation (or capping) steps may be performed in separate chambers as long as the substrate remains under vacuum between the implantation and oxidation/capping process.

While the foregoing is directed to embodiments of the present invention, other and further embodiments of the invention may be devised without departing from the basic scope thereof, and the scope thereof is determined by the claims that follow.

The invention claimed is:

1. A substrate processing method, comprising:
    implanting a dopant into a film to form an implanted film disposed on a substrate in a processing chamber;
    exposing the implanted film to an oxygen containing plasma to form an oxide layer on the implanted film and trap the dopant within the film prior to exposure of the implanted film to atmospheric oxygen;
    etching the film after the implanting and before the exposing, wherein the etching comprises exposing the implanted film to a plasma formed from $NF_3$; and
    exposing the implanted film to a hydrogen containing plasma separately from the oxygen containing plasma.

2. The method of claim 1, wherein the dopant is selected from the group consisting of arsenic, phosphorus, boron, and combinations thereof.

3. The method of claim 2, wherein the oxygen containing plasma is produced from oxygen gas.

4. The method of claim 3, wherein the implanting and the exposing occurs within the same processing chamber.

5. The method of claim 4, wherein the plasma is generated by a capacitively coupled source and wherein the plasma is generated by an inductively coupled source in addition to the capacitively coupled source.

6. The method of claim 4, wherein the plasma is generated by an inductively coupled source.

7. The method of claim 1, wherein the exposing the implanted film to a hydrogen containing plasma occurs after the implanting and before exposing to an oxygen containing plasma and wherein the exposing to a hydrogen containing plasma and exposing to an oxygen containing plasma occurs a plurality of times.

8. The method of claim 1, wherein the exposing the implanted film to a hydrogen containing plasma occurs after the implanting and after exposing to an oxygen containing plasma and wherein the exposing to a hydrogen containing plasma and exposing to an oxygen containing plasma occurs a plurality of times.

9. The method of claim 1, further comprising:
    depositing a capping layer over the oxide layer, wherein the capping layer is selected from the group consisting of a carbon layer, a silicon layer, a silicon oxide layer, a silicon nitride layer, a silicon carbide layer, an organic layer, and combinations thereof.

10. A substrate processing method, comprising:
    implanting a dopant into a film to form an implanted film disposed on a substrate in a processing chamber;
    depositing a capping layer over the dopant implanted film prior to exposure of the implanted film to atmospheric oxygen, wherein the capping layer is selected from the group consisting of a carbon layer, a silicon layer, a silicon oxide layer, a silicon nitride layer, a silicon carbide layer, an organic layer, and combinations thereof; and
    etching the film after the implanting and before the depositing, wherein the etching comprises exposing the implanted film to a plasma formed from $NF_3$.

11. The method of claim 10, wherein the implanting and the depositing occur within the same processing chamber.

* * * * *